United States Patent
Torazawa

(10) Patent No.: US 6,177,689 B1
(45) Date of Patent: Jan. 23, 2001

(54) PHOTOSENSITIVE DEVICE HAVING LIGHT TRANSMISSIVE SEALING RESIN WITH CARBONIZED OUTER SURFACE

(75) Inventor: Hiroyasu Torazawa, Tokyo (JP)

(73) Assignee: Oki Electric Industry Co., Ltd., Tokyo (JP)

(*) Notice: Under 35 U.S.C. 154(b), the term of this patent shall be extended for 0 days.

(21) Appl. No.: 09/348,755

(22) Filed: Jul. 7, 1999

Related U.S. Application Data

(62) Division of application No. 09/184,837, filed on Nov. 3, 1998, now Pat. No. 6,037,188.

(30) Foreign Application Priority Data

Jan. 14, 1998 (JP) .................................................. 10-17849

(51) Int. Cl.[7] .......................... H01L 27/15; H01L 31/12; H01L 33/00
(52) U.S. Cl. ............................. 257/81; 257/82; 257/100; 257/433
(58) Field of Search .................................. 257/80, 81, 82, 257/99, 100, 433

(56) References Cited

U.S. PATENT DOCUMENTS 5,705,833 * 1/1998 Noguchi et al. ........................ 257/81
5,770,867 * 6/1998 Sata et al. ............................... 257/31

* cited by examiner

Primary Examiner—Minh Loan Tran
(74) Attorney, Agent, or Firm—Jones Volentine, LLC

(57) ABSTRACT

A photosensitive semiconductor device includes a photocoupler sealed within a sealing body which is composed of a light-transmissive resin material. An outer surface of the sealing body is carbonized to block external light and thus minimized the adverse effects of noise.

6 Claims, 3 Drawing Sheets

PHOTOSENSITIVE DEVICE HAVING LIGHT TRANSMISSIVE SEALING RESIN WITH CARBONIZED OUTER SURFACE

CROSS REFERENCE TO RELATED APPLICATIONS

This is a divisional application of application Ser. No. 09/184,837, filed Nov. 3, 1998, U.S. Pat. No. 6,037,188, which is hereby incorporated by reference in its entirety for all purposes.

BACKGROUND OF THE INVENTION

1. Field of the Invention:

This invention relates to a photosensitive semiconductor device like a photocoupler and a method of manufacturing the photosensitive semiconductor device.

2. Description of the Related Art:

A photocoupler for transmitting a signal with light as a medium is provided with a light-emitting device for converting an electric signal into a lightwave signal and a light-receiving or -detecting device for converting light emitted from the light-emitting device into an electric signal.

A light-emitting surface of the light-emitting device and a light-detecting surface of the light-detecting device face each other and they are held within a casing.

As one example of this casing, there is known a casing having a double mold structure which comprises an inward mold resin portion and an outward mold resin portion for covering the inward mold resin portion.

The inward mold resin portion is composed of a mold resin having a light-transmissive property. The inward mold resin portion is charged between both devices without inhibiting the transmission of a lightwave signal between both devices. Further, the inward mold resin portion serves so as to position both devices in a predetermined posture and improve electrical insulating properties thereof owing to the direct covering of their electrical connecting portions therewith.

The outward mold resin portion is composed of a mold resin having a lightproof property. The outward mold resin portion serves so as to perform a lightproof effect for preventing the entrance of externally-incoming light between both devices owing to the covering of the inward mold resin portion therewith. The lightproof effect of the outward mold resin portion prevents the mixing of noise between both devices due to the externally-incoming light.

SUMMARY OF THE INVENTION

With the foregoing in view, it is therefore an object of the present invention to simplify a manufacturing process.

It is another object of the present invention to achieve compaction of a photosensitive semiconductor device without the generation of noise due to externally-incoming light.

According to one aspect of this invention, for achieving the above object, there is provided a photosensitive semiconductor device, comprising:

a sealing body composed of a resin material for sealing photosensitive semiconductor elemental devices, a inside of the sealing body having a light-transmissive property, a surface of the sealing body composed of the resin material containing carbon.

Further, the present application discloses other various inventions made to achieve the above objects. They will become apparent from the following claims, respective embodiments and accompanying drawings.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENT

Figure 1:
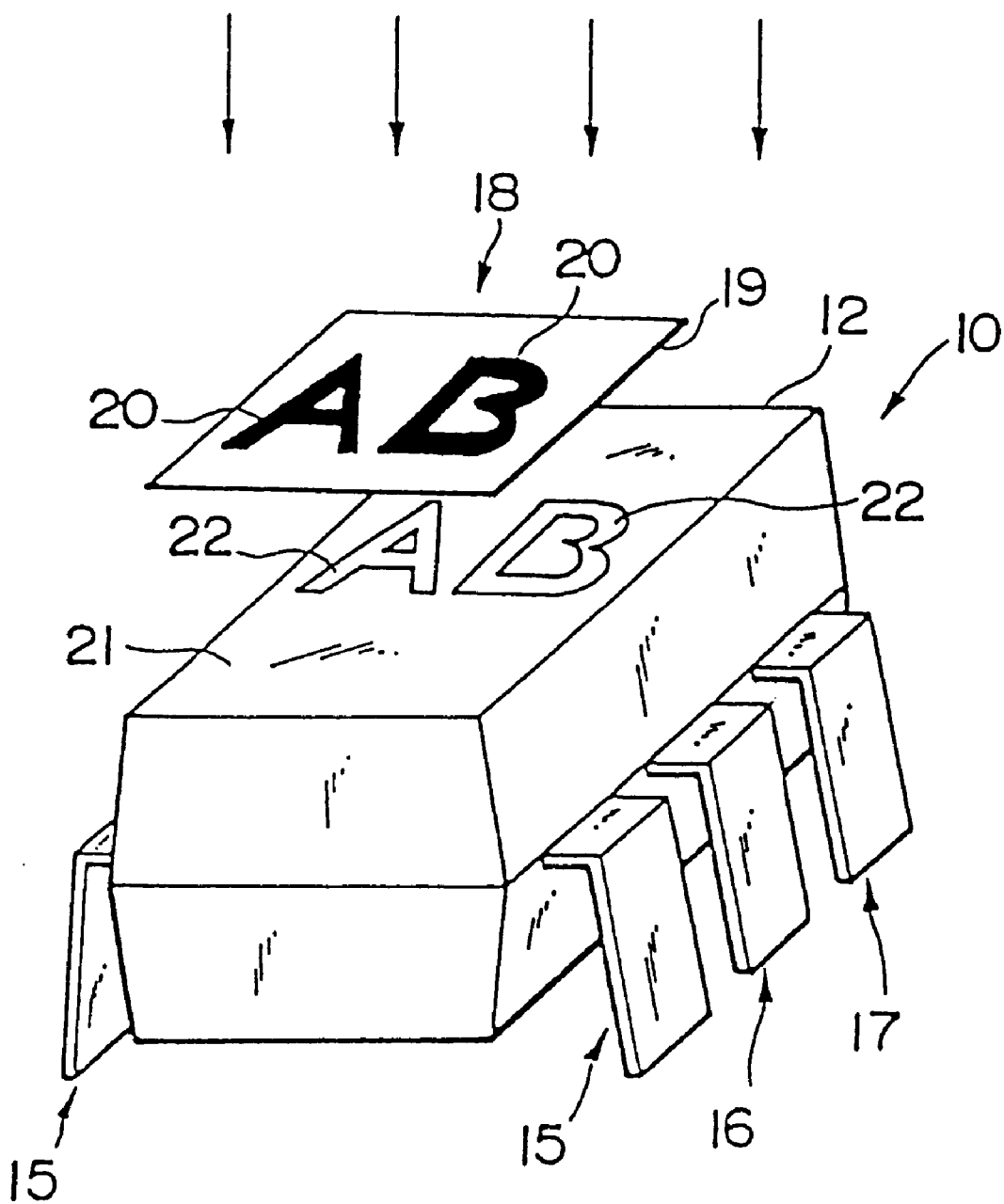
FIG. 1 is a perspective view showing an outward appearance of a photocoupler according to one embodiment of the present invention together with printing means.
Figure 2:
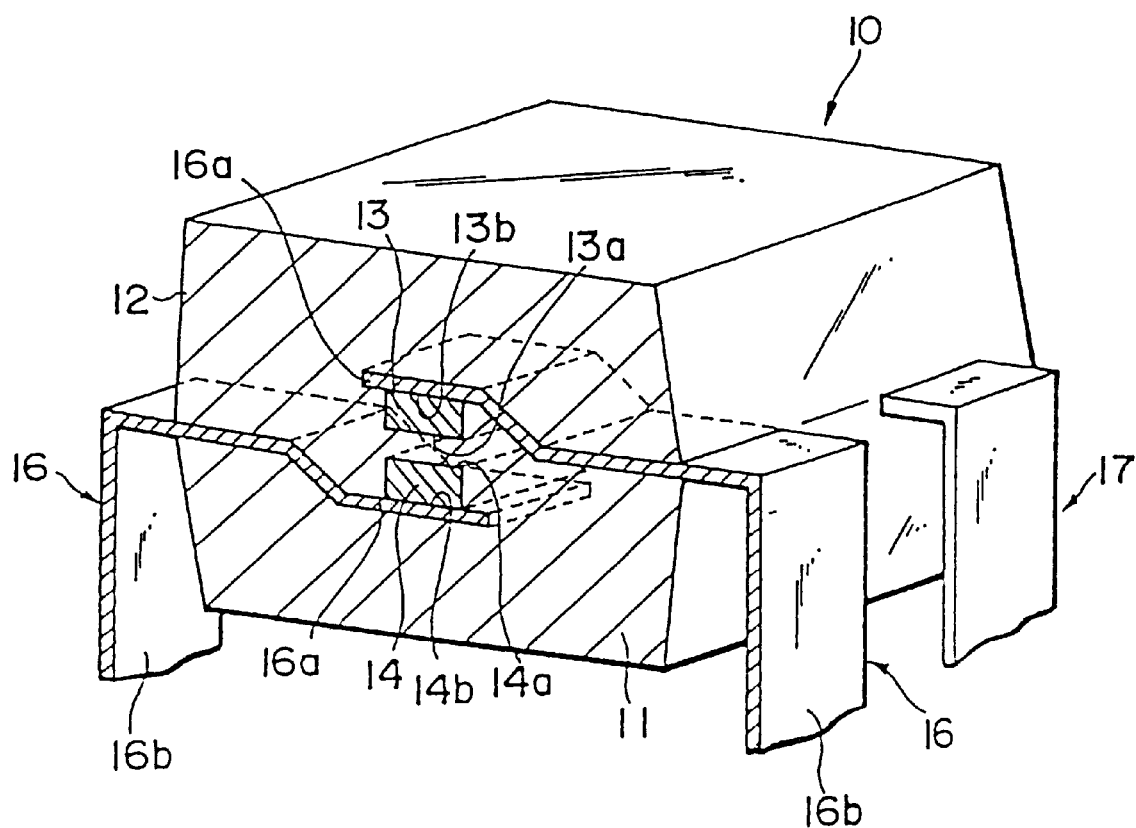
FIG. 2 is a cross-sectional view illustrating an internal structure of the photocoupler shown in FIG. 1.

FIG. 1 is a view showing an outline of a photocoupler according to one embodiment of the present invention. FIG. 2 is a view-illustrating an internal structure of the photocoupler shown in FIG. 1.

The photocoupler 10 includes a sealing body 11. The sealing body 11 is composed of, for example, a resin material. The inside of the sealing body 11 is composed of a white epoxy resin material having a translucence or light-transmissive property. A light-intransmissive or light-proof film 12 covering the inside of the sealing body 11 has not a translucence or light-transmissive property.

As shown in FIG. 2, two photosensitive semiconductor elemental devices 13 and 14 are contained in the sealing body 11. The photosensitive semiconductor elemental device 13 is a light- or photo-emitting device comprised of, for example, a light-emitting diode for converting an electric signal into a lightwave signal. The photosensitive semiconductor elemental device 14 is a light-receiving or -detecting device comprised of, for example, a photodiode for converting light emitted from the light-emitting device 13 into an electric signal. The light-emitting device 13 and the light-detecting device 14 are respectively placed within the sealing body 11 so that their light-emitting and light-detecting surfaces 13a and 14a are opposite to each other.

A pair of electrodes (not shown) for applying a voltage to the light-emitting device 13 is provided on the back 13b of the light-emitting device 13, which is opposite to the light-emitting surface 13a corresponding to the surface of the light-emitting device 13. A pair of electrodes (not shown) for applying a voltage to the light-detecting device 14 is provided on the back 14b thereof opposite to the light-detecting surface 14a corresponding to the surface of the light-detecting device 14.

Further, respective internal ends 15a and 15a, 16a and 16a, and 17a and 17a of three pairs of leads 15 and 15, 16 and 16, and 17 and 17 are contained in the sealing body 11.

Of the two pairs of leads 15 and 15, and 16 and 16, the internal ends 15a and 16a of the respective one leads 15 and 16 are respectively electrically connected to the pair of electrodes provided on the back 13b of the light-emitting device 13 as a pair. The internal ends 15a and 16a of the respective other leads 15 and 16 are respectively electrically connected to the pair of electrodes provided on the back 14b of the light-detecting device 14 as another pair.

The respective internal ends 17a of the pair of leads 17 and 17 are provided as connecting terminals used for an additional circuit.

The leads 15, 16 and 17, which constitute the respective pairs, respectively extend through the peripheral surface of the sealing body 11 and the lightproof film 12 from the sides of the sealing body 11 so as to protrude outwardly.

External ends 15b, 16b and 17b correspond to portions which are led out to the outsides of the leads 15, 16 and 17. The external ends 15b, 16b and 17b are respectively constructed as connecting terminals used for connection to an external circuit.

Thus, the leads 15, 16 and 17 serve as mechanical supports and electrical wiring portions used for the light-emitting device 13, the light-detecting device 14 and the additional circuit.

The light-emitting device 13 is supplied with a voltage through one pair of leads 15 and 16 connected thereto. The light-emitting device 13 converts an electric signal corresponding to the voltage into a lightwave signal. The light-detecting device 14 supplied with the converted lightwave signal converts the lightwave signal into an electric signal. The electric signal is outputted through the other pair of leads 15 and 16 electrically connected to the light-detecting device 14.

The sealing body 11 seals the internal ends 15a, 16a and 17a of the respective leads 15, 16 and 17, and the light-emitting device 13 and the light-detecting device 14 electrically connected to the internal ends 15a and 16a. The sealing body 11 fixes the positions of the light-emitting device 13 and the light-detecting device 14 relative to each other and compensates for insulating properties among the respective leads 15, 16 and 17 electrically connected to both devices 13 and 14 or the like.

A part of the sealing body 11 exists between both devices 13 and 14. Since the sealing body 11 allows penetration of light therethrough, the transmission of the light between the light-emitting device 13 and the light-detecting device 14 is not blocked.

When the light incident from the outside of the sealing body 11 passes through the sealing body 11 and is applied to a light-activated unit including a light communication path between the light-emitting device 13 and the light-detecting device 14, the externally-incoming light will result in noise produced in lightwave signal between the light-emitting device 13 and the light-detecting device 14. In order to prevent the noise from being caused by the externally-incoming light, the lightproof film 12 for covering the inside of the sealing body 11 is formed.

By irradiating the surface of the sealing body 11 with laser light or effecting ink printing on the sealing body 11, the lightproof film 12 can be efficiently manufactured. As shown in FIG. 2, the lightproof film 12 is formed so as to cover the inside of the sealing body 11.

The method of forming the lightproof film 12 by laser is explained.

Upon irradiation of the surface of the sealing body 11 with the laser light, a laser such as a YAG laser employed in laser marking, for example, can be used.

The sealing body 11 is uniformly irradiated with laser light by the laser over its entire surface. The surface of the sealing body 11, which has been irradiated with laser light by the laser, is carbonized. Thus, a carbonized layer having a substantially uniform thickness dimension of, e.g., several tens of $\mu$m enough to have a lightproof property is uniformly formed in the surface of the sealing body 11. Accordingly, the lightproof film 12 composed of the carbonized layer is formed covering the inside of the sealing body 11 by the laser irradiation.

Upon the laser irradiation, the respective surfaces of the sealing body 11 are successively scanned by, for example, a focused light beam. Collective laser irradiation may be adopted every surfaces such as the top face, bottom face, etc. of the sealing body 11.

The method of forming the lightproof film 12 by ink printing is explained.

When the ink printing is used for the formation of the lightproof film 12, printing ink like a phenolic resin containing pigment, for example, is used as ink for the ink printing.

When the printing ink is applied to the entire surface of the sealing body 11, e.g., a spray system using a sprayer or the like or an applying system using a printing brush or the like as well as a stamping system to be described later can be suitably adopted for its application.

An applied layer having a thickness dimension of, e.g., several tens of $\mu$m enough to have a lightproof property is formed over the surface of the sealing body 11 by the application of the printing ink thereon. The applied layer is constructed as a lightproof film 12 similar to that composed of the carbonized layer.

The lightproof film 12 for covering the surface of the sealing body 11 prevents the entrance of the externally-incoming light into the light-activated unit so as to protect the light-activated unit from the externally-incoming light. Thus, noise can be reliably prevented from being produced due to the externally-incoming light.

Further, the lightproof film 12 is formed in an extremely uniform and thin film-thickness dimension as compared with the lightproof portion wherein the periphery of the inward mold resin of the prior device is molded by the outward mold resin.

Thus, according to the method of manufacturing the photocoupler 10 according to the present invention, since the molding process used for the formation of the lightproof film alone becomes unnecessary, the manufacturing process can be simplified.

According to the photocoupler 10 of the present invention, the lightproof film 12 having the extremely uniform and thin film-thickness dimension can protect the light-activated unit from the externally-incoming light. Thus, the photocoupler 10 is prevented from unstably operating due to the mixing of noise therein and can be rendered compact in size.

In general, the name of a maker and a product number or the like are applied to the surface of the photocoupler 10. The lightproof film 12 employed in the present invention may be formed by making use of printing means used for their printing.

As the printing means, laser irradiation and ink printing similar to the above can be applied.

In FIG. 1, the photocoupler 10 to which printing is made by the laser irradiation, is shown and a mask 18 used for printing is illustrated.

The printing mask 18 has a substrate 19 having a light-transmissive property. Printing portions 20 such as numerals, characters or symbols are formed on the substrate 19.

The printing portions 20 are formed by selectively evaporating or vapor-depositing a metal material such as chromium having a lightproof property on printing areas onto the substrate 19.

In the printing process using the mask 18, the mask 18 is placed on a printing surface 21 of the sealing body 11 so as to cover the printing surface. Laser light is applied to the printing surface 21 collectively or by beam-scanning through the mask 18. Owing to the application of the laser light thereto, other area other than areas of the printing surface 21, which correspond to the printing portions 20 of the mask 18, is carbonized.

The printing portions 20 of the mask 18 will not transmit the laser light therethrough. Thus, only printed portions 22 corresponding to the printing portions 20 are not carbonized as shown in FIG. 1. The printed portions 22 comprised of the non-carbonized surfaces, of the printing surface 21 of the sealing body 11 are represented as reversed characters.

Since the printed portions 22 serve as the non-carbonized surfaces, they exhibit permeability. However, the printed portions 22 are formed by thin lines each having a width less than 0.5 mm, for example. The printed portions 22 are no more than the occupation of areas extremely smaller than the area for the printing surface 21. Even if light is transmitted through the printed portions 22, the transmitted light is dispersed within the sealing body 11. Thus, the transmitted light no serves as noise.

Accordingly, a light-transmissive film 12 similar to the above can be formed in the printing process using the conventional printing means and hence a photocoupler 10 can be manufactured more efficiently.

Figure 3:
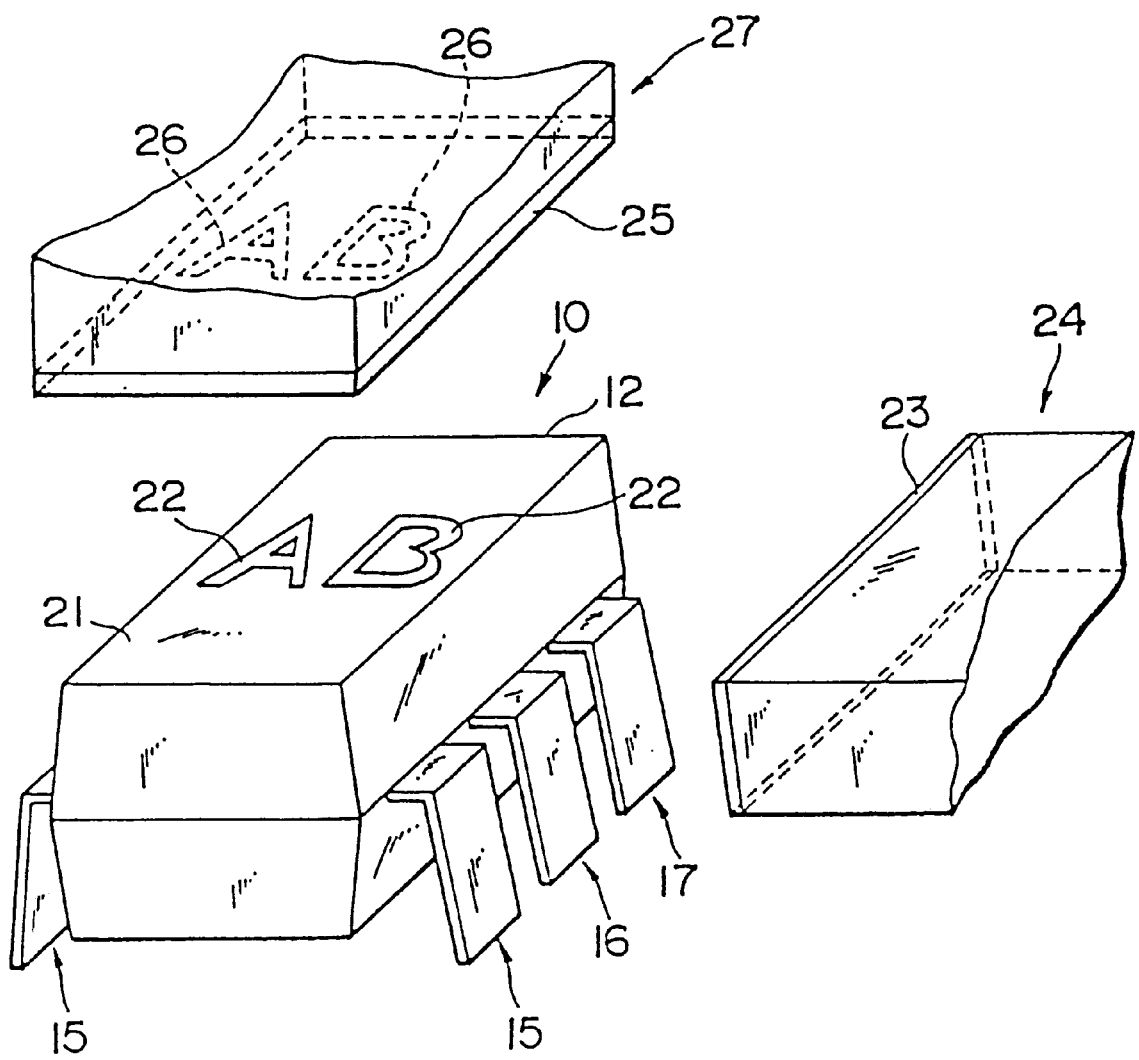
FIG. 3 is a perspective view the outward appearance of the photocoupler shown in FIG. 1 together with another printing means.

FIG. 3 is a diagram showing a printing process using ink printing.

The above-described printing ink used for the formation of the light-transmissive film 12 is uniformly applied onto a non-printing surface of the sealing body 11 of the photocoupler 10 by using a stamp 24 having a flat sealing surface 23.

On the other hand, a stamp 27 in which concave printing portions 26 are defined in a flat sealing surface 25, is applied to a printing surface 21.

According to the stamp 27, the printing ink can be applied onto an area other than areas corresponding to the concave printing portions 26. The printing ink can be applied to the area other than printing portions 22 of the printing surface 21, so that the printing portions 22 are left on the printing surface 21 of the sealing body 11 as reversed characters.

Thus, a lightproof film 12 similar to the above can be formed in the printing process using the conventional stamping printing method in the same manner as in the case of the laser irradiation. As a result, the photocoupler 10 can be fabricated with efficiency.

Thus, the present embodiment has described an example in which the present invention has been applied to the photocoupler wherein the photosensitive semiconductor elemental devices sealed in the sealing body are comprised of the light-emitting device and the light-detecting device respectively. The present invention is not necessarily limited to this. The present invention can be applied to various photosensitive semiconductor devices as well as to an isolator wherein a single photosensitive elemental device is sealed in a sealing body.

A description has been made of the example in which the white epoxy resin is used as the material for the sealing body. However, other resin materials may be suitably selected and used as the material for the sealing body.

A further description has been made of the example in which the lightproof film is formed by the carbonization of the sealing body and the coating film. The lightproof film may be formed by an oxide film or the like formed owing to the oxidation of the surface of the sealing body.

In the present embodiment, the sealing body can be formed in the single molding process. Further, the lightproof film is formed with a thickness dimension smaller than that of the outward mold resin formed in the molding process. As a result, a photosensitive semiconductor device can be rendered compact in size.

While the present invention has been described with reference to the illustrative embodiment, this description is not intended to be construed in a limiting sense. Various modifications of the illustrative embodiment will be apparent to those skilled in the art on reference to this description. It is therefore contemplated that the appended claims will cover any such modifications or embodiments as fall within the true scope of the invention.

What is claimed is:

1. A photosensitive semiconductor device, comprising:
   a photocoupler;
   a sealing body composed of a light-transmissive resin material and having said photocoupler sealed therein, wherein an outer surface of said sealing body is carbonized.

2. The photosensitive semiconductor device according to claim 1, wherein said outer surface of said sealing body is carbonized by irradiation of laser light.

3. The photosensitive semiconductor device according to claim 1, wherein said outer surface of said sealing body further includes printed matter.

4. The photosensitive semiconductor device according to claim 3, wherein said outer surface of said sealing body is carbonized be laser irradiation at surface portions other than a location of said printed matter.

5. The photosensitive semiconductor device according to claim 1, wherein a thickness of a carbonized surface portion of the sealing body is less than 0.25 mm.

6. The photosensitive semiconductor device according to claim 1, wherein the photocoupler includes a light emitting device and a light receiving device, and wherein a portion of said light-transmissive resin material of said sealing body extends between said light emitting device and said light receiving device.

* * * * *